United States Patent
Oh et al.

(10) Patent No.: US 9,276,119 B2
(45) Date of Patent: Mar. 1, 2016

(54) METHOD OF MANUFACTURING STRETCHABLE SUBSTRATE AND STRETCHABLE SUBSTRATE MANUFACTURED USING THE METHOD

(71) Applicant: Electronics and Telecommunications Research Institute, Daejeon (KR)

(72) Inventors: Ji-Young Oh, Daejeon (KR); Jae Bon Koo, Daejeon (KR); Sang Chul Lim, Daejeon (KR); Chan Woo Park, Daejeon (KR); Soon-Won Jung, Daejeon (KR); Bock Soon Na, Daejeon (KR); Sang Seok Lee, Sejong (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/243,768

(22) Filed: Apr. 2, 2014

(65) Prior Publication Data

US 2015/0048375 A1 Feb. 19, 2015

(30) Foreign Application Priority Data

Aug. 19, 2013 (KR) ........................ 10-2013-0098057

(51) Int. Cl.
*H01L 29/786* (2006.01)
*B29C 59/02* (2006.01)
*B29C 43/02* (2006.01)
(Continued)

(52) U.S. Cl.
CPC ........ *H01L 29/78603* (2013.01); *B29C 43/021* (2013.01); *B29C 43/18* (2013.01); *B29C 43/203* (2013.01); *B29C 59/02* (2013.01); *B29C 71/04* (2013.01); *B29C 35/0266* (2013.01);
(Continued)

(58) Field of Classification Search
CPC ................... H01L 2924/00; H01L 2924/0002; H01L 2924/12041; H01L 2924/19041; H01L 2924/13091; H01L 2924/00014; H01L 2924/1461; H01L 2224/05644
See application file for complete search history.

(56) References Cited

U.S. PATENT DOCUMENTS

| 8,198,621 | B2 | 6/2012 | Rogers et al. | |
|---|---|---|---|---|
| 8,217,381 | B2 * | 7/2012 | Rogers et al. | 257/9 |
| 2013/0244145 | A1 * | 9/2013 | Lee et al. | 430/7 |

FOREIGN PATENT DOCUMENTS

KR 10-2009-0092982 A 9/2009

OTHER PUBLICATIONS

Ingrid M. Graz et al., "Flexible pentacene organic thin film transistor circuits fabricated directly onto elastic silicone membranes", Applied Physics Letters, Dec. 18, 2009, pp. 1-3, vol. 95, No. 243305, American Institute of Physics.

(Continued)

*Primary Examiner* — Tony Tran

(57) ABSTRACT

Provided is a method of manufacturing a gradually stretchable substrate. The method includes forming convex regions and concave regions on a top surface of a stretchable substrate by compressing a mold onto the stretchable substrate and forming non-stretchable patterns by filling the concave regions of the stretchable substrate. The stretchable substrate includes a stretchable region defined by the non-stretchable patterns, the non-stretchable patterns have side surfaces in contact with the stretchable region, and the side surfaces of the non-stretchable patterns are formed of protrusions and a non-protrusion between the protrusions repetitively connected to one another.

5 Claims, 10 Drawing Sheets

(51) Int. Cl.
   *B29C 71/04* (2006.01)
   *B29C 43/18* (2006.01)
   *B29C 43/20* (2006.01)
   *B29K 75/00* (2006.01)
   *B29K 21/00* (2006.01)
   *B29K 83/00* (2006.01)
   *B29C 35/02* (2006.01)

(52) U.S. Cl.
   CPC ......... *B29K2021/00* (2013.01); *B29K 2075/00* (2013.01); *B29K 2083/00* (2013.01); *Y10T 428/19* (2015.01)

(56) References Cited

OTHER PUBLICATIONS

Ingrid M. Graz et al., "Silicone substrate with in situ strain relief for stretchable thin-film transistors", Applied Physics Letters, Mar. 22, 2011, pp. 1-3, vol. 98, No. 124101, American Institute of Physics.

Kyungyea Park et al., "Stretchable, Transparent Zinc Oxide Thin Film Transistors", Advanced Functional Materials, Aug. 18, 2010, pp. 3577-3582, vol. 20, Wiley-VCH Verlag GmbH & Co. KGaA, Weinheim.

* cited by examiner

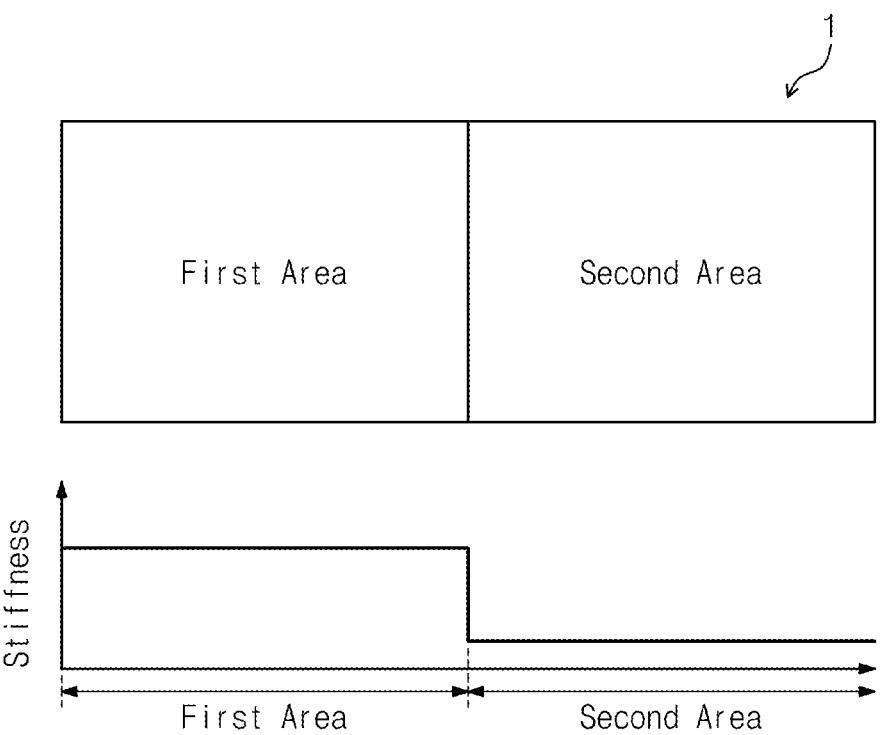

METHOD OF MANUFACTURING STRETCHABLE SUBSTRATE AND STRETCHABLE SUBSTRATE MANUFACTURED USING THE METHOD

CROSS-REFERENCE TO RELATED APPLICATIONS

This U.S. non-provisional patent application claims priority under 35 U.S.C. §119 of Korean Patent Application No. 10-2013-0098057, filed on Aug. 19, 2013, the entire contents of which are hereby incorporated by reference.

BACKGROUND OF THE INVENTION

The present invention disclosed herein relates to a method of manufacturing a stretchable substrate and a stretchable substrate manufacturing using the method, and more particularly, to a method of manufacturing a gradually stretchable substrate and a stretchable substrate manufacturing using the method.

Stretchable electronic circuits, differing from general flexible devices capable of only being bendable, may be applicable in various fields such as sensor skin for robots, wearable communication devices, internal or attachable bio-elements, and next-generation displays. Accordingly, researches for embodying stretchable electronic circuits have been progressed.

Materials forming electronic devices are strong but intrinsically brittle and have lower expandability against strain. Accordingly, to embody stretchable electronic circuits including electronic devices, a method of forming only a metallic wiring portion connecting electronic devices to have a stretchable structure is generally used. However, when only the metallic wiring portion connecting electronic devices and stretchable maintains stretchability, while being stretched or contracted, strain is transferred from the metallic wiring portion to the electronic devices, thereby deteriorating properties of the electronic devices.

SUMMARY OF THE INVENTION

The present invention provides a method of manufacturing a gradually stretchable substrate.

The present invention also provides a gradually stretchable substrate.

Embodiments of the inventive concept provide methods of manufacturing a gradually stretchable substrate including forming convex regions and concave regions on a top surface of a stretchable substrate by compressing a mold onto the stretchable substrate and forming non-stretchable patterns by filling the concave regions of the stretchable substrate. The stretchable substrate includes a stretchable region defined by the non-stretchable patterns, the non-stretchable patterns have side surfaces in contact with the stretchable region, and the side surfaces of the non-stretchable patterns are formed of protrusions and a non-protrusion between the protrusions repetitively connected to one another.

In some embodiments, the stretchable substrate may be one of a polydimethylsiloxane (PDMS) substrate and a polyurethane substrate.

In other embodiments, the forming of the non-stretchable patterns may include applying a non-stretchable material film onto the stretchable substrate formed with the convex regions and the concave regions and etching the non-stretchable material film formed on the convex regions of the stretchable substrate.

In still other embodiments, the non-stretchable pattern may include hard-PDMS.

In even other embodiments, the protrusions may have one of a triangular shape, a tetragonal shape, and a circular shape.

In other embodiments of the inventive concept, methods of manufacturing a gradually stretchable substrate include disposing a mask pattern on a stretchable substrate and exposing a light onto the stretchable substrate to forma plurality of regions of the stretchable substrate, a dose of the light provided by the mask pattern differently. The plurality regions of the stretchable substrate may have a smaller intensity of stretchability as the dose of light is increase.

In some embodiments, the stretchable substrate may be a photo-curable PDMS (hv-PDMS) substrate.

In other embodiments, the mask pattern may include holes.

In still other embodiments, the mask pattern may include a central portion, a first edge portion disposed on one side of the central portion, and a second edge portion disposed on another side of the central portion, and a width of the holes may gradually increase from the first edge portion to the central portion and may gradually decrease from the central portion to the second edge portion.

In even other embodiments, the regions of the stretchable substrate may include a central region, a first edge region, and a second edge region, and the central region may correspond to the central portion of the mask pattern, the first edge region may correspond to the first edge portion of the mask pattern, and the second edge region may correspond to the second edge portion of the mask pattern.

In yet other embodiments, the regions of the stretchable substrate may include a central region, a first edge region, and a second edge region, and the central region may have a smaller intensity of stretchability than the first edge region and the second edge region.

In still other embodiments of the inventive concept, gradually stretchable substrates include a stretchable substrate and non-stretchable patterns embedded in the stretchable substrate. The stretchable substrate includes a stretchable region defined by the non-stretchable patterns, the non-stretchable pattern have side surfaces in contact with the stretchable region, and the side surfaces of the non-stretchable patterns are formed of protrusions and a non-protrusion between the protrusions repetitively connected to one another.

In some embodiments, the protrusions may have a triangular shape, a tetragonal shape, and a circular shape.

In other embodiments, the non-stretchable patterns may include a first region, a second region disposed on one side of the first region, and a third region disposed on another side of the first region, and the second region and the third region may include the side surfaces of the non-stretchable patterns in contact with the stretchable region.

In still other embodiments, the gradually stretchable substrate may include an electronic device disposed on the non-stretchable patterns. In this case, the electronic device may include a gate electrode disposed on the first region, a gate insulating film disposed on the gate electrode, the second region and the third region, a source electrode and a drain electrode disposed on the gate insulating film of the second region and the third region each other, and a semiconductor layer covering a top surface of the gate insulating film between the source electrode and the drain electrode.

In even other embodiments, the first region may have a smaller intensity of stretchability than the second region and the third region.

In yet other embodiments, the stretchable substrate may further include a fourth region adjacent to the second region and a fifth region adjacent to the third region, in which the fourth region and the fifth region may be exposed to the gate insulating film.

In further embodiments, the fourth region and the fifth region may have greater intensities of stretchability than the second region and the third region.

In still further embodiments, metallic wirings may be disposed on the fourth region and the fifth region.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings:

FIGS. 1A and 1B are graphs illustrating a mechanism of a gradually stretchable substrate according to an embodiment of the inventive concept;

DETAILED DESCRIPTION OF PREFERRED EMBODIMENTS

Figure 1B:
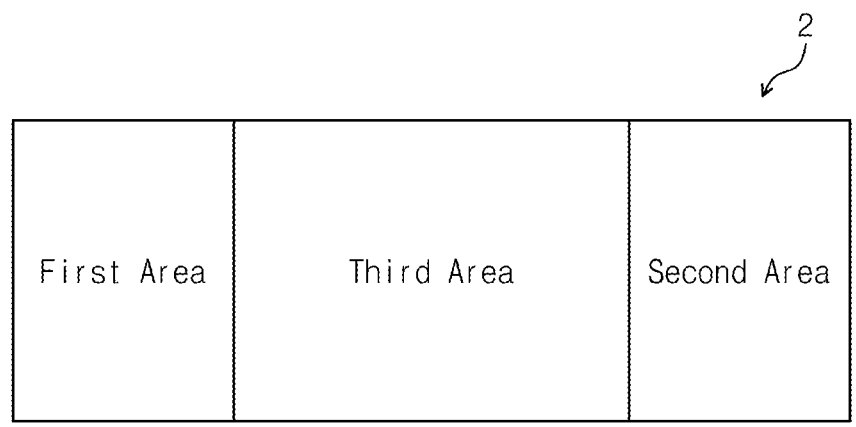
Figure 1B:
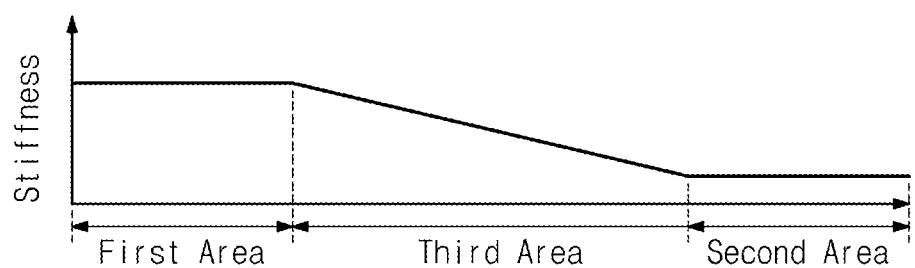

Preferred embodiments of the inventive concept will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Through the entire specification, like reference numerals designate like elements.

Terms used in the specification are to describe the embodiments but not to limit the scope of the present invention. As used herein, the singular forms are intended to include the plural forms as well, unless the context clearly indicates otherwise. It will be further understood that the terms "comprises" and/or "comprising" used herein specify the presence of stated features or components, but do not preclude the presence or addition of one or more other features or components.

Also, the embodiments described in the specification will be explained with reference to cross-sectional views and/or top views. In the drawings, thicknesses of a film and an region may be exaggerated to effectively explain technical contents. Accordingly, shapes shown in the drawings may be changed by manufacturing technology and/or tolerable errors. Accordingly, the embodiments of the inventive concept are not limited to certain shapes but include variances in shapes formed according to a manufacturing process. For example, an etching region shown in a right-angled shape may be rounded or may be a shape having a certain curvature. Accordingly, regions shown in the drawings have schematic properties and shapes of regions shown in the drawings are just to illustrate certain shapes of elements but not to limit the scope of the present invention.

FIGS. 1A and 1B are graphs illustrating a mechanism of a gradually stretchable substrate 2 according to an embodiment of the inventive concept.

Referring to FIG. 1A, a stretchable substrate 1 includes a first region and a second region. The first region is a solid region, and the second region is a flexible region having excellent stretchability. Electronic devices may be disposed in the first region, and metallic wirings may be disposed on the second region. When expansion and contraction are applied to the stretchable substrate, since a difference in stretchability between the first region and the second region is great, a force applied to the second region may be directly transferred to the first region. According thereto, mechanical damages and deteriorations in electric properties of the electronic devices may be caused.

On the contrary, referring to FIG. 1B, the stretchable substrate 2 includes a first region, a second region, and a third region between the first region and the second region. The first region is a solid region having little stretchability, the second region is a flexible region having excellent stretchability, and the third region has intermediate stretchability between the stretchabilities of the first region and the second region. In more detail, the third region may be gradually stretchable more and more from the second region to the first region. Compared with the stretchable substrate described with reference to FIG. 1A, when expansion and contraction are applied to the stretchable substrate 2, a force applied to the second region is not directly transferred to the first region and may be gradually buffered in the third region. Accordingly, a separation between the first region and the second region caused by the expansion and contraction does not occur and the mechanical damages and deteriorations in electric properties of the electronic devices formed in the first region may be prevented.

FIGS. 2A to 2D are cross-sectional views illustrating a method of manufacturing a gradually stretchable substrate according to an embodiment of the inventive concept. FIGS. 3A to 3C are enlarged top views illustrating A of FIG. 2D, which is a part of the gradually stretchable substrate manufactured by using the method.

Figure 2A:
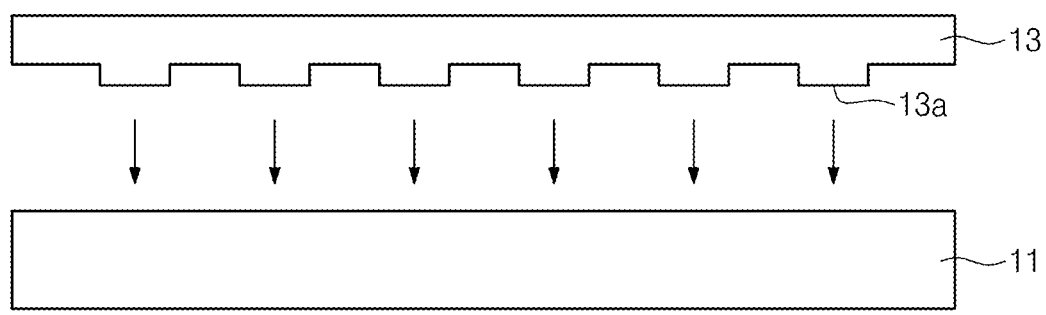
FIGS. 2A to 2D are cross-sectional views illustrating a method of manufacturing a gradually stretchable substrate according to an embodiment of the inventive concept.
Figure 2B:
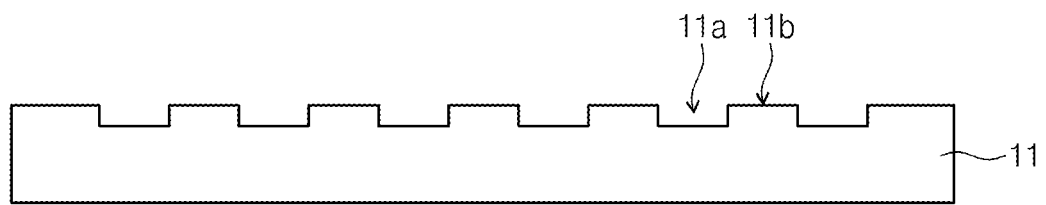
Figure 3A:
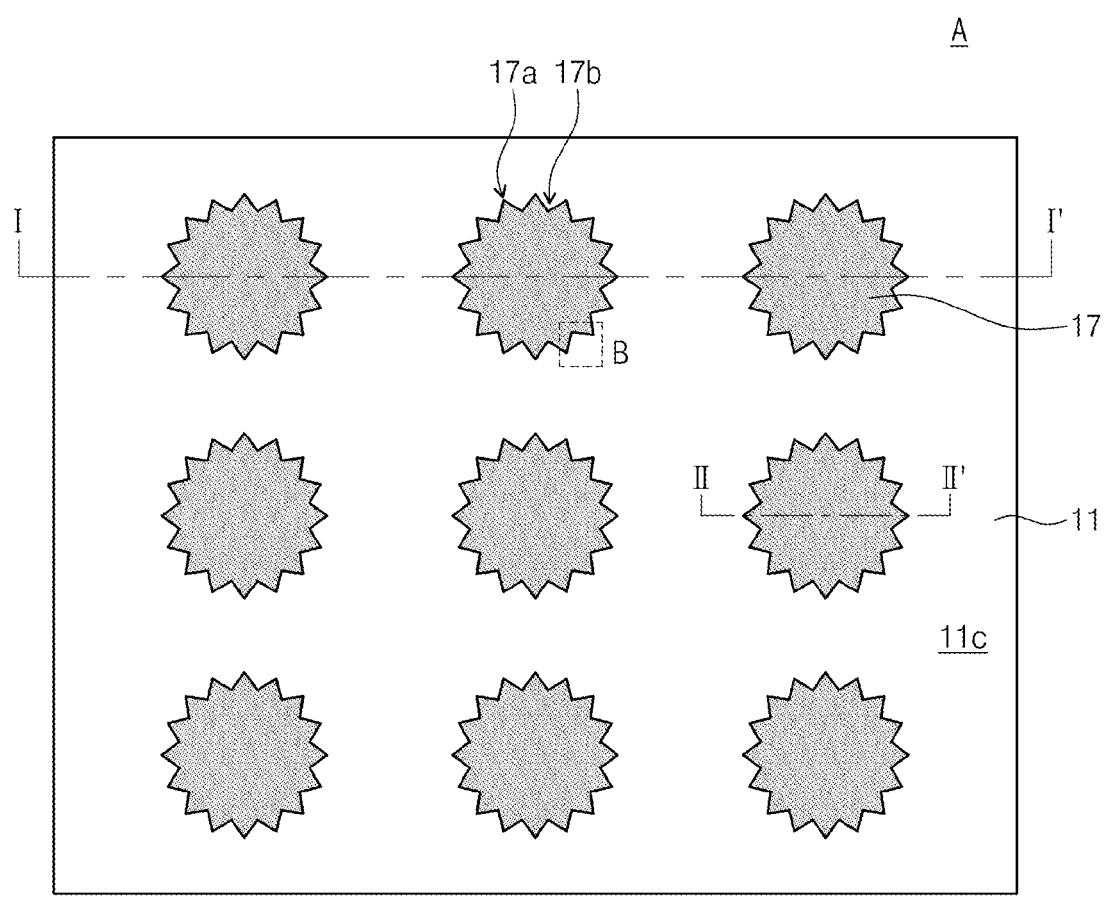
FIGS. 3A to 3C are enlarged top views illustrating A of FIG. 2D, which is a part of the gradually stretchable substrate manufactured by using the method.
Figure 3B:
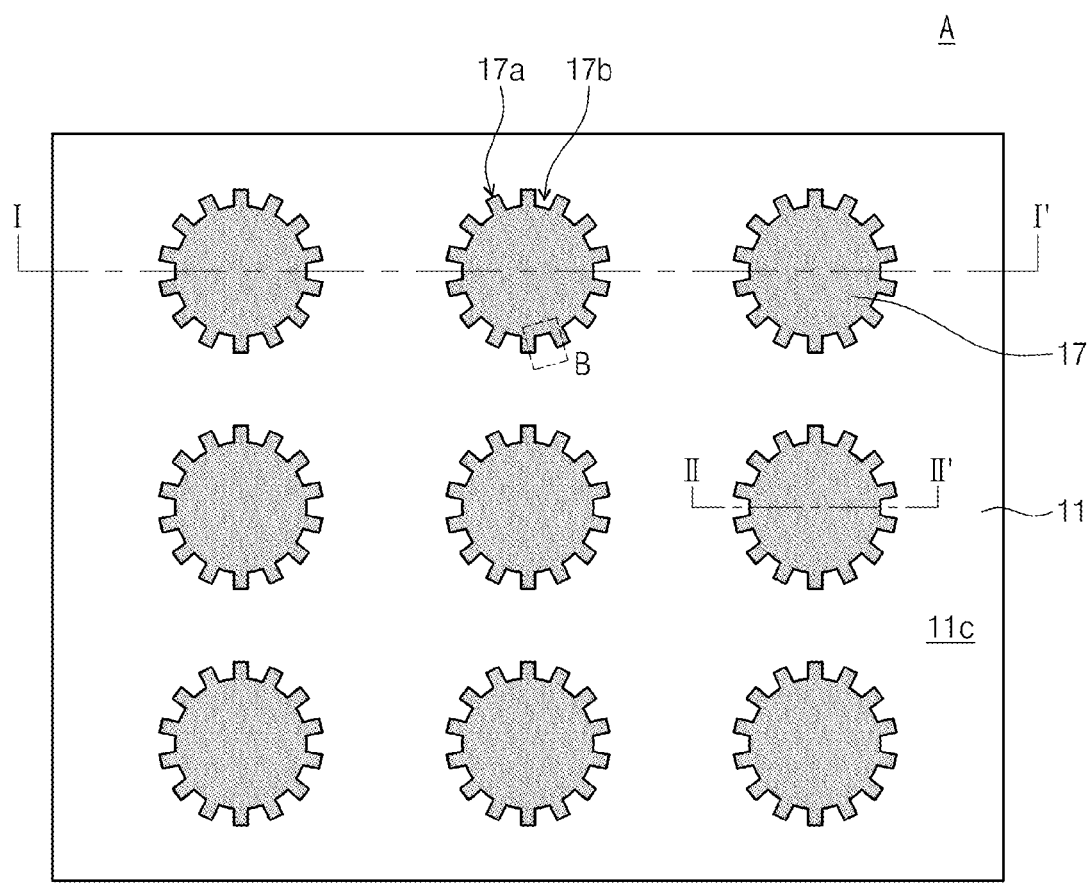
Figure 3C:
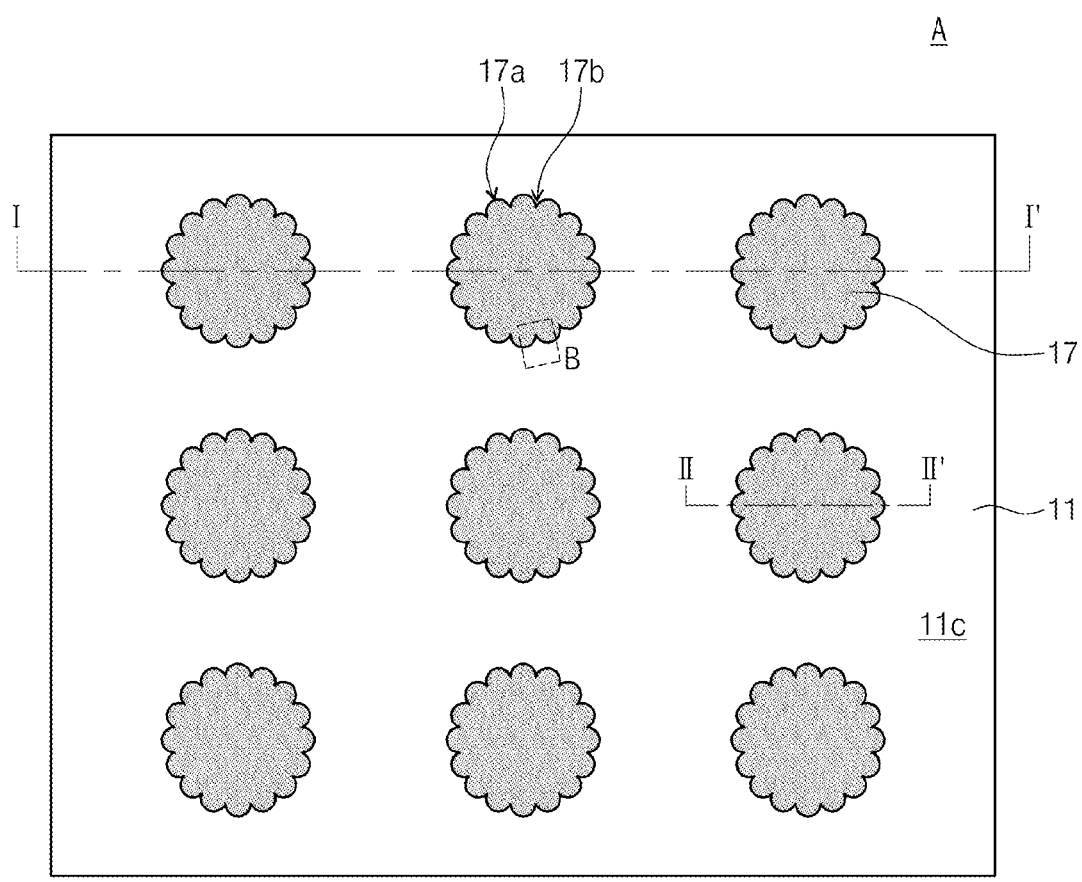

Referring to FIGS. 2A and 2B, a substrate 11 is prepared. The substrate 11 is a stretchable substrate formed of a material easily deformable and having elasticity against an external stimulus. The substrate 11 may be, for example, one of a polydimethylsiloxane (PDMS) substrate and a polyurethane substrate.

A mold 13 is physically compressed to the substrate 11. In detail, the mold 13 is disposed to correspond to a top surface of the substrate 11 and then a pressure may be applied to the top surface of the substrate 11. According thereto, concave regions 11a and convex regions 11b may be formed on the top surface of the substrate 11. The mold 13 may have a compression portion 13a, which may compress the top surface of the substrate 11. A shape of the compression portion 13a determines a shape of non-stretchable patterns 17 formed in a following process.

Figure 2C:
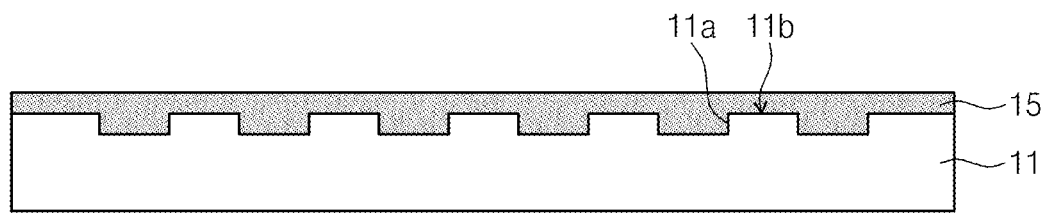

Referring to FIG. 2C, a non-stretchable material is applied onto the substrate 11, thereby forming a non-stretchable material film 15. The non-stretchable material film 15 may be a hard-PDMS film. The non-stretchable material film 15 may be formed onto the substrate 11 by using an inkjet printing process or a screen printing process. The non-stretchable material film 15 may cover the top surface of the substrate 11 and may fill the concave regions 11a of the substrate 11.

Figure 2D:
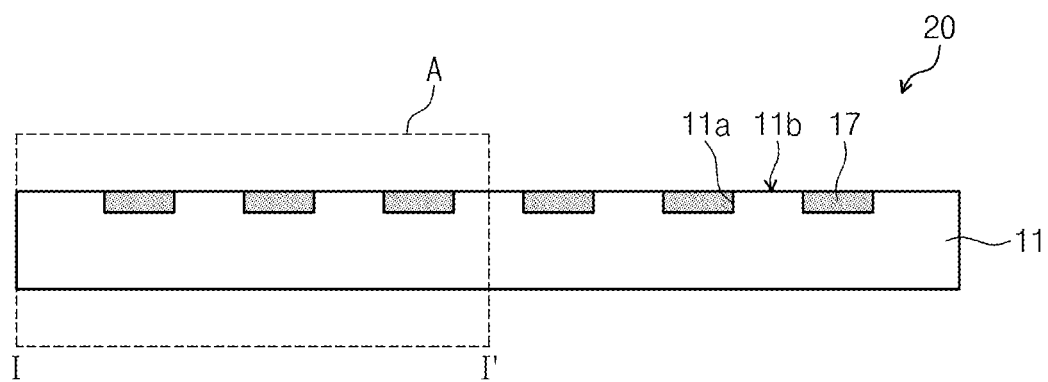

Referring to FIG. 2D, the non-stretchable material film 15 formed on the convex regions 11b of the substrate 11 is etched. According thereto, the non-stretchable patterns 17 are formed on the concave regions 11a of the substrate 11, thereby forming a gradually stretchable substrate 20 including the non-stretchable patterns 17 in the substrate 11.

Referring to FIGS. 2D and 3A to 3C, a stretchable region 11c of the substrate 11 may be defined by the non-stretchable patterns 17. Sides of the non-stretchable patterns 17 in contact with the stretchable region 11c may be configured by repetitively connecting protrusions 17a with a non-protrusion 17b between the protrusions 17a. The protrusions 17a may have a triangular shape, a tetragonal shape, or a circular shape. The non-protrusion 17b between the protrusions 17a may have B regions engaged with the stretchable region 11c. The B regions may be an region in which stretchability between the substrate 11 and the non-stretchable pattern 17 is gradually changed. For example, the stretchability of the B regions may be an intermediate intensity between intensities of stretchability of the non-stretchable patterns 17 and the substrate 11.

According to the embodiment, electronic devices 100 (refer to FIG. 4) may be formed on the non-stretchable patterns 17 and metallic wirings (not shown) may be formed on the stretchable region 11c of the gradually stretchable substrate 20. When a force of stretching and/or contraction is applied to the substrate 11, the force is buffered in the B region and does not have an effect on the electronic devices 100 formed on the non-stretchable patterns 17. Accordingly, a deterioration in electric properties of the electronic devices may be prevented.

Figure 4A:
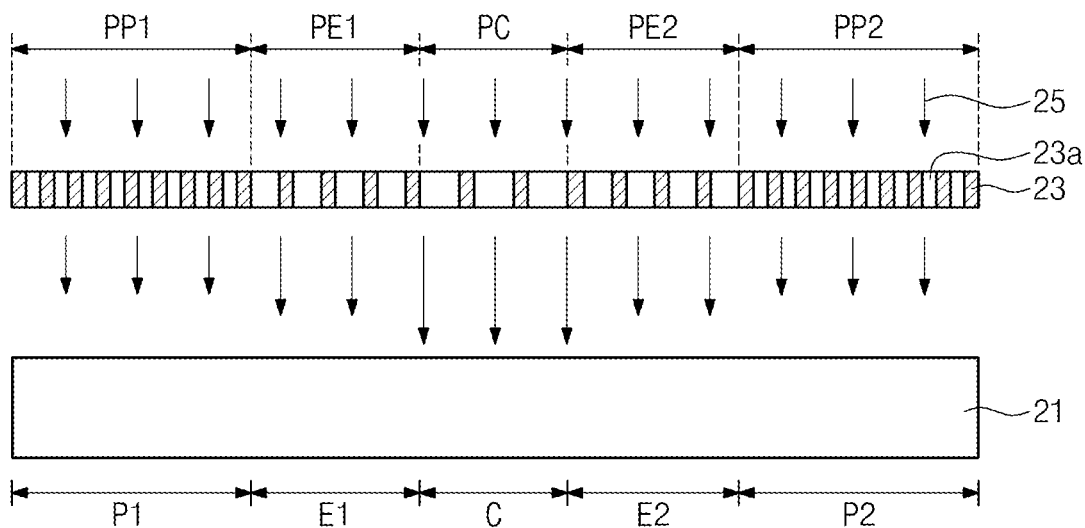
FIGS. 4A and 4B are cross-sectional views illustrating a method of manufacturing a gradually stretchable substrate according to another embodiment of the inventive concept.
Figure 4B:
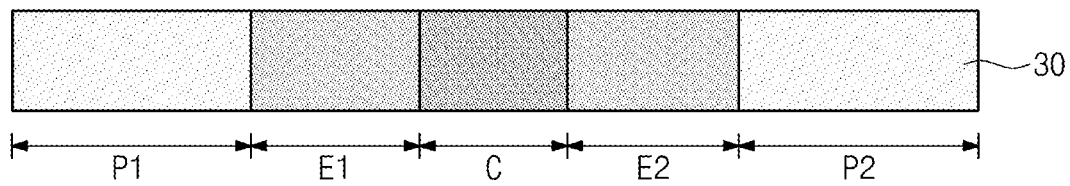

FIGS. 4A and 4B are cross-sectional views illustrating a method of manufacturing a gradually stretchable substrate according to another embodiment of the inventive concept.

Referring to FIGS. 4A and 4B, a substrate 21 is prepared. The substrate 21 may include a material reacting to light and having a degree of curing variable with a dose of the light. The substrate 21 may be, for example, a photo-curable PDMS (hv-PDMS). The substrate 21 may include a central region C, a first edge region E1, a first outermost edge region P1, a second edge region E2, and a second outermost edge region P2.

A photomask 23 is disposed on the substrate 21, and a light 25 may be emitted to the substrate 21 through the photomask 23. The photomask 23 may include holes 23a allowing the light 25 to penetrate. The photomask 23 includes a central portion PC and first edge portion PE1 and a second edge portion PE2 located on both sides of the central portion PC. In more detail, the first edge portion PE1 includes a first outermost edge portion PP1 located in an outermost region in the first edge portion PE1 and the edge portion PE2 includes a second outermost edge portion PP2 located in an outermost region in the second edge portion PE2.

A width of the holes 23a may gradually increase from the first outermost edge portion PP1 to the central portion PC and may gradually decrease from the central portion PC to the second outermost edge portion PP2. In detail, a width of the holes 23a forming the first outermost edge portion PP1 may be smaller than a width of the holes 23a forming the first edge portion PE1. Similarly, a width of the holes 23a forming the second outermost edge portion PP2 may be smaller than a width of the holes 23a forming the second edge portion PE2. The widths of the holes 23a forming the first and second edge portions PE1 and PE2 may be smaller than a width of the holes 23a forming the central portion PC.

According thereto, a does of light provided onto the central region C may be greater than a dose of light of the first and second edge portions PE1 and PE2 to be emitted to the first and second edge regions E1 and E2 of the substrate 21. Additionally, the dose of light of the first and second edge regions E1 and E2 may be greater than a dose of light of the first and second outermost edge regions P1 and P2 of the substrate 21.

A gradually stretchable substrate 30 having different intensities of stretchability when the does of light is differently provided by the photomask 23. In detail, a region, to which the dose of light is increase, is less deformed at the intensity of stretchability of the substrate. For example, the first and second outermost edge regions P1 and P2 of the gradually stretchable substrate 30 may have greater stretchability than the first and second edge regions E1 and E2 of the gradually stretchable substrate 30. Also, the first and second edge regions E1 and E2 of the gradually stretchable substrate 30 may have greater stretchability of the central region C of the gradually stretchable substrate 30. Accordingly, the stretchability of the gradually stretchable substrate 30 may become gradually smaller from the first outermost edge region P1 to the central region C and may become gradually greater from the central region C to the second outermost edge region P2.

Figure 5:
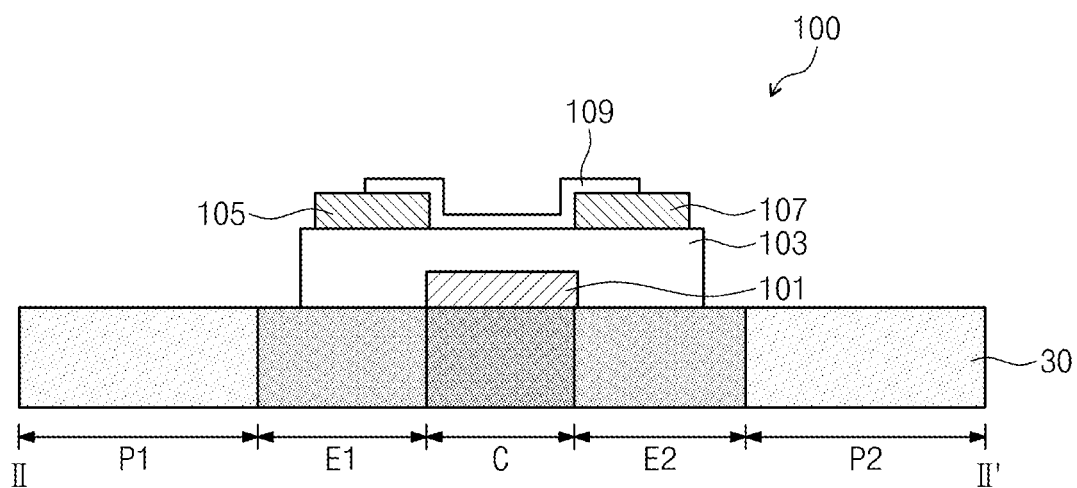
FIG. 5 is a cross-sectional view illustrating an electronic device including the gradually stretchable substrate manufactured by using the methods, taken along a line n-n' in FIGS. 3A to 3C.

FIG. 5 is a cross-sectional view illustrating an electronic device including the gradually stretchable substrate manufactured by using the methods, taken along a line n-n' in FIGS. 3A to 3C. For conciseness of description, in the embodiment shown in FIG. 5, like reference numerals are used to designate like elements and a description thereof will be omitted.

Referring to FIG. 5, the electronic device 100 may be formed on the gradually stretchable substrate 30. The electronic device 100 may be a transistor. A gate electrode 101 may be formed on the central region C of the stretchable substrate 30. The gate electrode 101 may include polysilicon or a metal material. A gate insulating film 103 covering the gate electrode 101 may be formed above the gradually stretchable substrate 30. The gate insulating film 103 may be formed on the first and second edge regions E1 and E2. The gate insulating film 103 may be an organic film such as a parylene film or an inorganic film such as a silicon dioxide ($SiO_2$) film and a silicon nitride ($SiN_x$) film.

A source electrode 105 and a drain electrode 107 may be formed on the gate insulating film 103. The source electrode 105 and the drain electrode 107 may be separated from each other. The source electrode 105 and the drain electrode 107 may include a metal material, for example, tungsten (W), copper (Cu), chrome (Cr), molybdenum (Mo), silver (Ag), and gold (Au).

A semiconductor layer 109 may be formed on the gate insulating film 103 exposed between the source electrode 105 and the drain electrode 107. The semiconductor layer 109 may be extended to top surfaces of the source electrode 105 and the drain electrode 107. The semiconductor layer 109 may be one of an organic semiconductor layer, a silicon semiconductor layer, and an oxide semiconductor layer.

Not shown in the drawings, metallic wirings (not shown) may be formed on the first and second outermost edge regions P1 and P2 of the gradually stretchable substrate 30. The metallic wirings may electrically connect a plurality of transistors formed on the gradually stretchable substrate 30.

According to the embodiment, when forming the electronic device 100 on the gradually stretchable substrate 30, although forces of stretching and contraction having a certain intensity is applied to the first and second outermost edge regions P1 and P2 formed with the metallic wirings, the force is not all transferred to the central region C of the gradually stretchable substrate 30 formed with the electronic device 100. In other words, an intensity of stretchability of the first and second edge regions E1 and E2 is intermediate between intensities of stretchability of the first and second outermost edge regions P1 and P2 and the central region C. According thereto, the force applied to the first and second outermost edge regions P1 and P2 is buffered in the first and second edge regions E1 and E2 and is not all transferred to the central region C. Accordingly, the deterioration in electric properties of the electronic device 100 formed on the gradually stretchable substrate 30, caused by the forces of stretching and contraction, may be prevented.

Figure 6A:
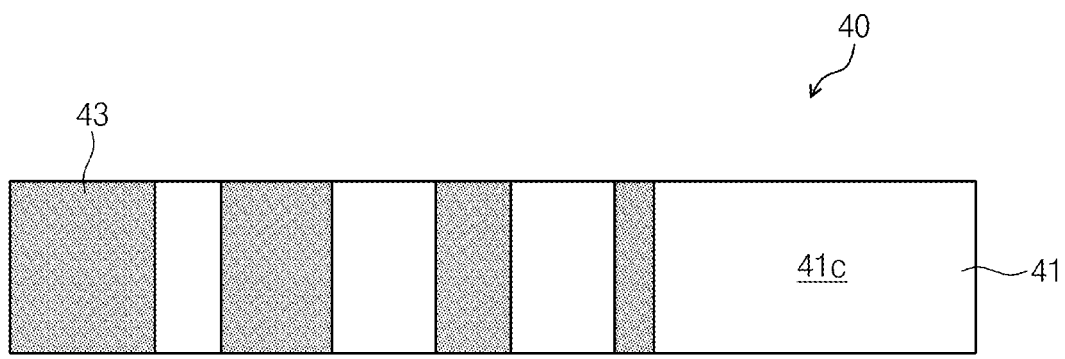
FIGS. 6A to 6C are cross-sectional views illustrating the gradually stretchable substrates manufactured by using the methods.
Figure 6B:
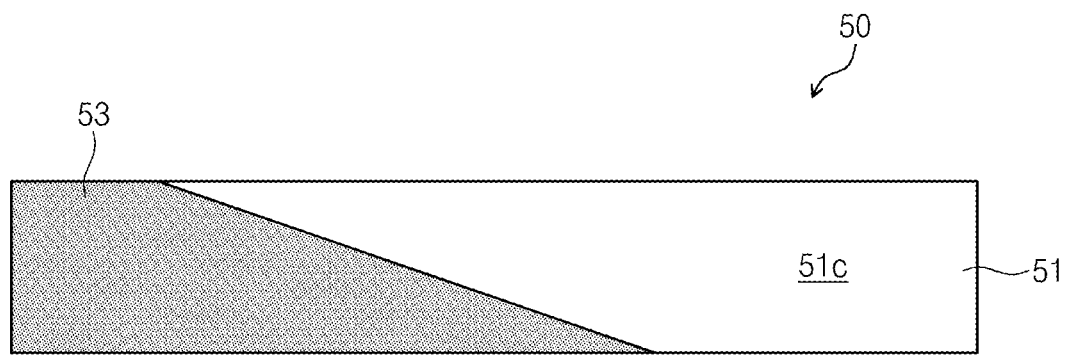
Figure 6C:
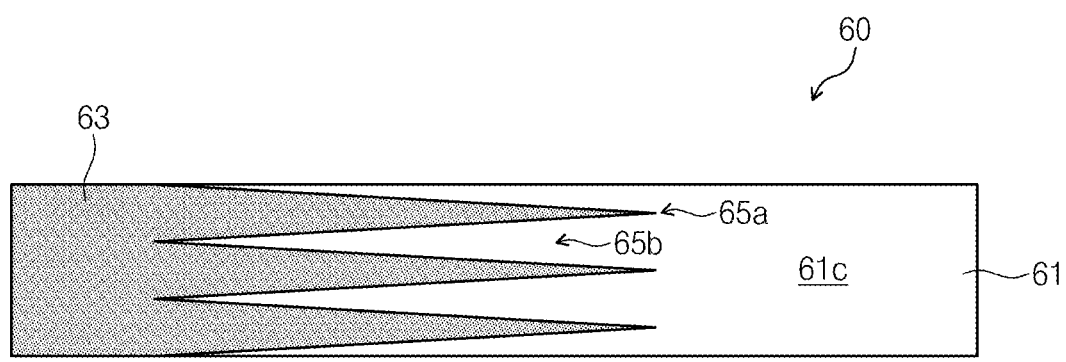

FIGS. 6A to 6C are cross-sectional views illustrating the gradually stretchable substrates manufactured by using the methods.

Referring to FIGS. 6A to 6C, gradually stretchable substrates 40, 50, and 60 may include substrates 41, 51, and 61 and non-stretchable patterns 43, 53, and 63 formed on the substrates 41, 51, and 61, respectively. Stretchable regions 41c, 51c, and 61c of the gradually stretchable substrates 40, 50, and 60 may be defined in the substrates 41, 51, and 61 by the non-stretchable patterns 43, 53, and 63. The substrates 41, 51, and 61 may be stretchable substrates.

As shown in FIG. 6A, a plurality of non-stretchable patterns 43 may be formed in the substrate 41 to have the same height of the substrate 41. Intervals between the non-stretchable patterns 43 may gradually increase in one direction and widths of the non-stretchable patterns 43 may gradually decrease at the same time. The intervals of the non-stretchable patterns 43 mean widths of the stretchable regions 41c. According thereto, since the widths of the stretchable regions 41c between the non-stretchable patterns 43 gradually increase, the gradually stretchable substrate 40 may have stretchability gradually increasing in the one direction.

As shown in FIG. 6B, a bottom surface of the non-stretchable pattern 53 may have the same plane as a bottom surface of the substrate 51 and a top surface of the non-stretchable pattern 53 may have the same plane as a top surface of the substrate 51. A height between one sidewall of the non-stretchable pattern 53 and the bottom surface of the substrate 51 may gradually decrease in one direction. That is, the one sidewall of the non-stretchable pattern 53 may be inclined from a top to a bottom of the non-stretchable pattern 53. According thereto, the gradually stretchable substrate 50 may have stretchability gradually increasing in the one direction.

As shown in FIG. 6C, a bottom surface of the non-stretchable pattern 63 may have the same plane as a bottom surface of the substrate 61 and a top surface of the non-stretchable pattern 63 may have the same plane as a top surface of the substrate 61. One sidewall of the non-stretchable pattern 63 may have protrusions 65a pointed in one direction and a dented portion 65b between the protrusions 65a. According thereto, the gradually stretchable substrate 60 may have a configuration, in which the non-stretchable pattern 63 and the stretchable region 61a are engaged with each other. The gradually stretchable substrate 60 may have stretchability gradually increasing in the one direction.

According to the embodiments, an electronic device is formed on a gradually stretchable substrate. Accordingly, although forces of stretching and contraction more than a certain intensity are applied to the gradually stretchable substrate, the forces are not directly transferred to the electronic device, thereby preventing a deterioration in electric properties of the electronic device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a gradually stretchable substrate, the method comprising:
    disposing a photomask on a photo-curable stretchable substrate, the photomask including an edge portion and a central portion; and
    exposing an edge region of the stretchable substrate to a first dose of light through holes in the edge portion, and a central region of the stretchable substrate to a second dose of the light through holes in the central portion, the first dose of light being lower than the second dose of light;
    forming an electric device directly on the exposed stretchable substrate by forming a gate electrode directly on the central region, and forming a gate insulating layer directly on the edge region,
    wherein the central region has a smaller intensity of stretchability than the edge region.

2. The method of claim 1, wherein the stretchable substrate is a photo-curable PDMS (hv-PDMS) substrate.

3. The method of claim 1, wherein the edge portion is a first edge portion, and
    wherein the photomask further comprises a second edge portion, the central portion disposed between the first edge portion and the second edge portion, and
    wherein widths of the holes gradually increase from the first edge portion to the central portion and gradually decrease from the central portion to the second edge portion.

4. The method of claim 1, wherein the edge region is a first edge region, and
    wherein the stretchable substrate further comprises a second edge region, and
    wherein the central region has a smaller intensity of stretchability than the first edge region and the second edge region.

5. The method of claim 1, wherein the edge region is directly adjacent to the central region.

* * * * *